United States Patent
Laska et al.

(10) Patent No.: US 6,309,920 B1
(45) Date of Patent: Oct. 30, 2001

(54) BIPOLAR TRANSISTOR WHICH CAN BE CONTROLLED BY FIELD EFFECT AND METHOD FOR PRODUCING THE SAME

(75) Inventors: Thomas Laska; Franz Auerbach, both of Munich; Heinrich Brunner, Dorfen; Alfred Porst; Jenoe Tihanyi, both of Munich; Gerhard Miller, Penzing, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/462,760

(22) PCT Filed: Jul. 20, 1998

(86) PCT No.: PCT/DE98/02033

§ 371 Date: Apr. 10, 2000

§ 102(e) Date: Apr. 10, 2000

(87) PCT Pub. No.: WO99/05713

PCT Pub. Date: Feb. 4, 1999

(30) Foreign Application Priority Data

Jul. 22, 1997 (DE) .............................. 197 31 495

(51) Int. Cl.[7] ............................................. H01L 21/8238
(52) U.S. Cl. ........................................... 438/202; 257/263
(58) Field of Search ..................... 438/202, 206, 438/268, 315, 338, 342, 350; 257/263

(56) References Cited

U.S. PATENT DOCUMENTS

| | | | |
|---|---|---|---|
| 5,025,293 | * 6/1991 | Seki | 357/23.4 |
| 5,216,275 | 6/1993 | Chen | 257/493 |
| 5,360,983 | 11/1994 | Iwamuro | 257/139 |
| 5,444,271 | 8/1995 | Kuwahara | 257/136 |
| 5,589,408 | * 12/1996 | Robb et al. | 437/29 |
| 5,668,385 | 9/1997 | Bauer et al. | 257/139 |
| 5,838,027 | * 11/1998 | Kim et al. | 257/139 |

FOREIGN PATENT DOCUMENTS

| | | |
|---|---|---|
| 4114349 | 5/1991 | (DE) . |
| 0330122 | 8/1989 | (EP) . |
| 0725446 | 8/1996 | (EP) . |

OTHER PUBLICATIONS

Patent Abstracts of Japan —vol. 018, No. 340 (e–159), Jun. 27, 1994 & JP 06 085269 a (Fuji Electric Co. Ltd), Mar. 25, 1994.

Article entitled "A simple Inexpensive Power Device", by F. Y. Robb, published on May 20, 1996, proceedings of the 8th International Symposium on Power Semiconductor Devices and IC'S (ISPSD), Maui, Hawaii, May 20–23, 1966.

Article entitled "Analysis of Direct Wafer Bond IGBTs With Heavy doped N+ Buffer Layer", by S. Larry Tu et al., published on May 20, 1996, Proceedings of the 8th International Symposium On Power Semiconductor Devices and IC'S (ISPSD), Maui, Hawaii, May 20–23, 1996.

* cited by examiner

*Primary Examiner*—David Nelms
*Assistant Examiner*—Quoc Hoang
(74) *Attorney, Agent, or Firm*—Irwin Ostroff; Arthur J. Torsiglieri

(57) ABSTRACT

A method for forming a field effect vertical bipolar transistor that includes a semiconductive body that has at its top surface a plurality of emitter zones of one conductivity type, each surrounded by a base zone of the opposite conductivity type, and gate electrodes for creating a channel at the surface through the base zone into the bulk inner portion of the one conduction type and at a bottom surface a collector zone that includes a collector electrode overlying a collector layer of the opposite conduction type overlying a field stop layer heavily doped of the opposite conduction type overlying the inner portion lightly doped of the one conduction type. Each of the collector layer and the field stop layer is less than 2 microns in thickness and the collector layer is used to inject minority carriers into the inner zone when appropriately biased.

5 Claims, 2 Drawing Sheets

Figure 1:
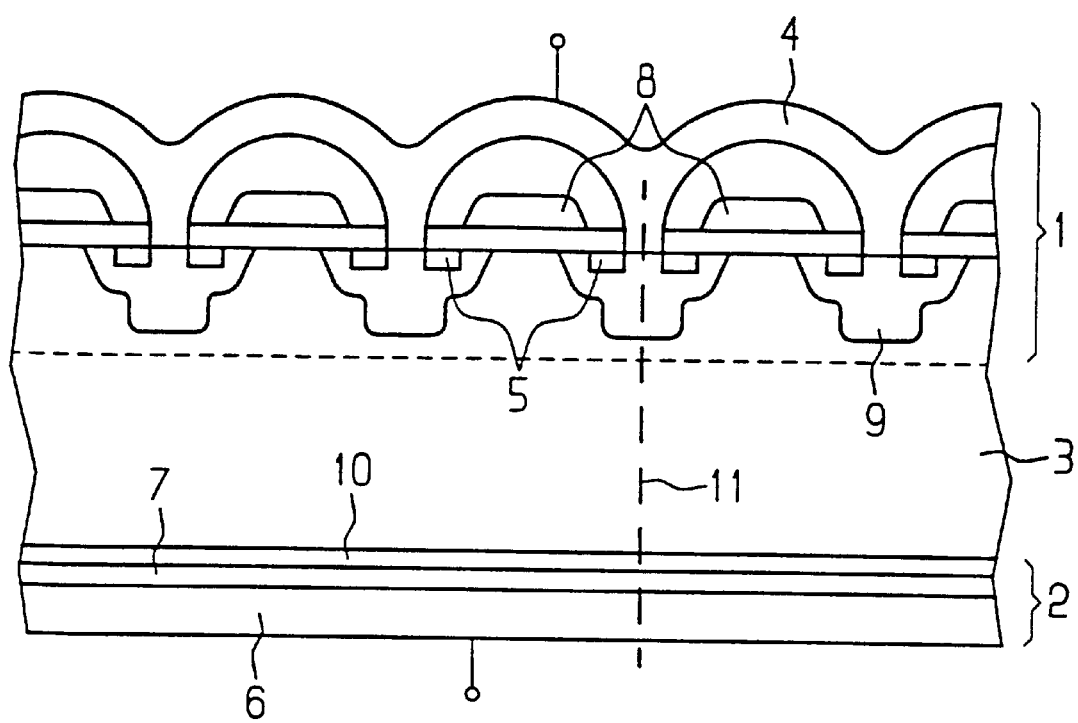

BIPOLAR TRANSISTOR WHICH CAN BE CONTROLLED BY FIELD EFFECT AND METHOD FOR PRODUCING THE SAME

The invention relates to a field effect-controllable vertical bipolar transistor, and in particular the structure of the same, and also to a method for fabricating a field effect-controllable vertical bipolar transistor.

Field effect-controllable vertical bipolar transistors or Insulated Gate Bipolar (IGBT) transistors are known from the literature or products and have a number of advantages over MOS-FETs, since their conductivity is determined by two charge-carrier types instead of just one. In order to inject a second charge-carrier type, their chip structure is modified by comparison with that of the MOS-FET to the effect that they have a layer on the rear side of the chip whose conduction type is opposite to that of the epitaxial layer or of the substrate: minority carriers are injected via a diode structure, and the layer sequence of the IGBT is similar to that of the thyristor. Another option for injecting minority carriers is to use a Schottky contact on the rear side.

Nowadays IGBTs are fabricated essentially in two forms, namely as a punch through- (PT-) and as a non-punch through- (NPT-) IGBT. Their structures differ in that, in the case of the PT-IGBT, a heavily doped (buffer) layer of the same conduction type as the inner zone lies between the rear side of the semiconductor chip with the collector terminal and the inner zone. This layer serves to weaken the heavily doped rear-side emitter (usually referred to as "collector"), and, like the inner zone, is generally allowed to grow epitaxially, as a result of which the fabrication is made considerably more expensive. Moreover, in the case of reverse-biasing, such a buffer layer reduces the field strength before the rear-side emitter layer is reached, thus serves as "field stop zone". This layer is not necessary in the case of the NPT-IGBT according to the prior art, since this NPT-IGBT has a sufficiently weakly injecting rear-side emitter. A sufficiently weakly injecting rear-side emitter is established in the case of the NPT according to the prior art. In order to achieve the same reverse voltage with the NPT-IGBT as with a PT-IGBT, the NPT-IGBTs must, in return, regularly be provided with a thicker $n^-$-type layer than the PT-IGBT. However, the thicker $n^-$-type layer has the disadvantage that it leads to larger forward voltages, i.e. to a larger voltage drop across the transistor in the on-state. Overall, however, the NPT-IGBT is constructed more simply and is less expensive to fabricate. These IGBTs and a method for fabricating them are disclosed in EP 0 330 122.

The object of the present invention is a method for fabricating a field effect-controllable bipolar transistor that a small forward voltage at a high reverse voltage and is simple to fabricate.

The inventive method for fabricating a field effect-controllable vertical bipolar transistor comprising an inner zone, which is of a first conduction type, a first zone having at least one first supply terminal (emitter) and at least one control electrode (gate), the said first zone adjoining the inner zone, and a second zone having a second supply terminal (collector), the said second zone adjoining the inner zone, having the following step: construction of the at least one supply terminal and the at least one control electrode on a first side of the substrate, is characterized by the following steps: production of a field stop zone, having a predetermined thickness, of the first conduction type on the second side of the substrate, adjoining the inner zone, and production of a collector layer as a Schottky or rectifying contact on the rear side.

In a preferred embodiment, the field stop zone is produced by the implantation of first ions in the inner zone, resulting in the formation of a layer of the first conduction type in the inner zone. It is preferable for the doping concentration in the field stop zone to be higher than that in the inner zone.

In a further preferred embodiment, the field stop zone is produced by the deposition of polysilicon doped to be of the first conduction type on the inner zone, resulting in the formation of a layer of the first conduction type on the inner zone.

As an alternative to producing the field stop zone by the deposition of doped polysilicon, in a further preferred embodiment of the methods the field stop zone is deposited as undoped polysilicon on the inner zone and subsequently doped by means of ion implantation.

The collector layer may be produced by the implantation of second ions in the field stop zone, and metal is deposited thereon, which metal may comprise a plurality of layer of different metals. The crystal defects produced during implantation are only partly annealed. The nature of the ion impairs the quality of the rectifying contact and thus influences the injection of the minority carriers. The second implantation may be made e.g. of gallium, argon, phosphorus, nitrogen, boron, arsenic. The implantation energy and the dose as well as the annealing temperature should be chosen such that ultimately the desired component properties, such as small stored charges, are achieved and the imperfections are annealed. A temperature <600° C. is suitable for this purpose.

After an implantation step, the bipolar transistor is preferably annealed at a predetermined temperature and for a predetermined time.

In a preferred embodiment, the method is implemented in such a way that the implantation of the field stop zone is carried out with a dose of essentially $10^{12}/cm^2$ and the implantation of the collector layer is carried out with a dose of more than $10^{12}/cm^2$.

The inventive field effect-controllable vertical bipolar transistor comprising an inner zone, which is of a first conduction type, a first zone having at least one first supply terminal (emitter) and at least one control electrode (gate), the said first zone adjoining the inner zone, and a second zone having a second supply terminal (collector), is characterized in that the second zone comprises a field stop zone, which adjoins the inner zone, and a collector layer, which adjoins the field stop zone, the thickness of the field stop zone and the thickness of the collector layer being less than 2 μm and the doping of the field stop zone corresponding to the first conduction type and the doping of the collector layer corresponding to a second conduction type. The inner zone is preferably homogeneously doped.

In the text below, "transistor" is to be understood to mean n- and p-channel transistors and also depletion-mode and enhancement-mode transistors.

In order to provide a better understanding, the invention is explained in more detail below, with further features and advantages being specified, using exemplary embodiments which are illustrated in drawings.

FIG. 1 shows the layer structure of a field stop zone-type IGBT fabricated by the method according to the invention.

Figure 2:
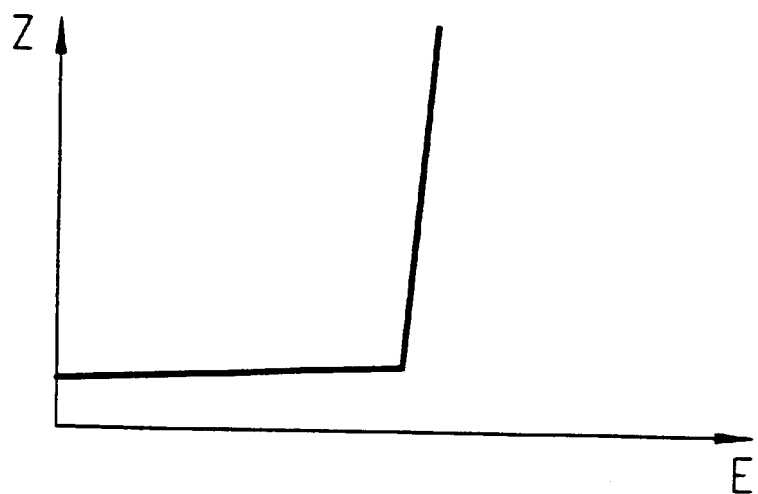

FIG. 2 diagrammatically shows the field profile in the field stop-zone type IGBT.

Figure 3:
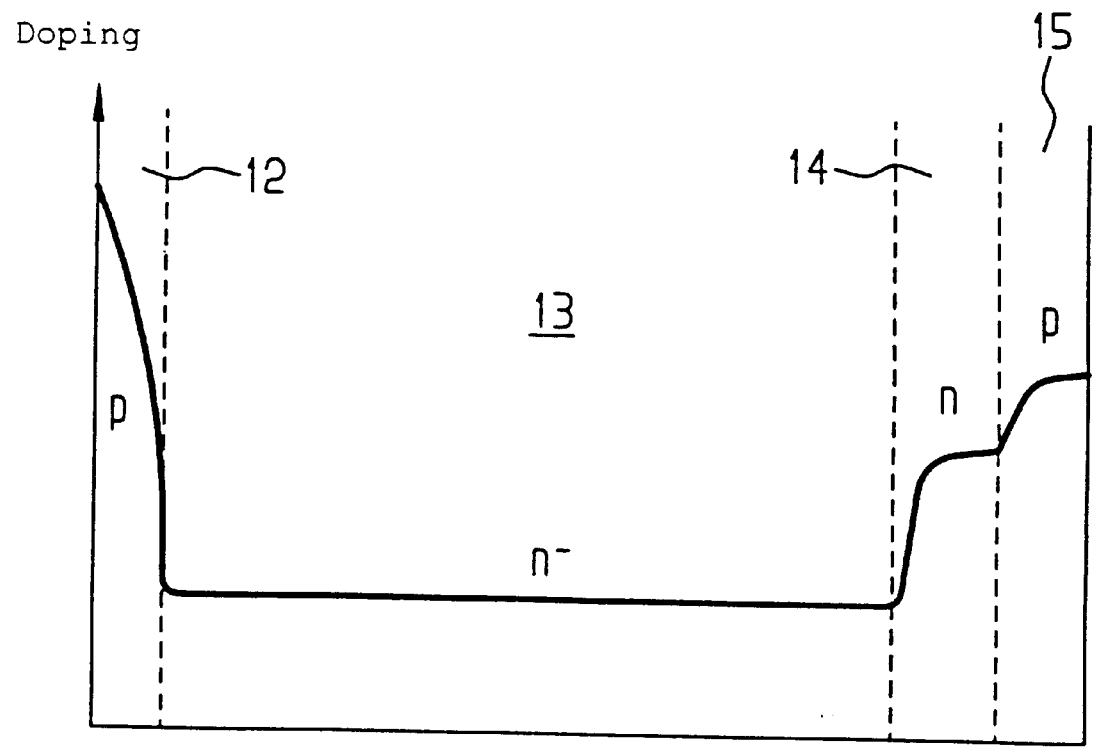

FIG. 3 shows the doping profile in the field stop-zone type IGBT according to the invention.

The semiconductor structure in FIG. 1 has a semiconductor substrate comprising, as a first subdivision, a first zone 1 at the top, a second zone 2 at the bottom, and an inner zone 3 between the first and second zones 1 and 2.

An emitter region 5 and a gate 8 are arranged in the first zone 1. The emitter region 5 is incorporated (diffused or implanted) into the semiconductor substrate and is routed electrically outwards via an emitter electrode 4. In this case, the emitter electrode 4 essentially comprises a metal layer that is in contact with the emitter region 5. Al is preferably used here as the contact-making metal. The gate 8 is deposited as a polysilicon layer on an oxide layer on the semiconductor substrate. The gate 8 is insulated from the semiconductor substrate by virtue of the oxide layer on the semiconductor substrate. The current flow in a base zone 9, which has been produced by implantation or diffusion in the semiconductor substrate, is controlled by way of the field effect by means of the gate. The base zone is of the opposite conduction type to the semiconductor substrate: if the semiconductor substrate is n-doped, then the base zone is p-doped and an on-state through an n-type channel is obtained in the base zone directly at the surface of the semiconductor substrate when given a suitable polarity of the gate and emitter terminals. It is equally possible for the semiconductor substrate to be p-doped and the transistor to form a p-type channel in n-type the base zone 9 in the on-state.

The charge carriers flowing through the channel flow through the inner zone 3 in the semiconductor substrate into the second zone 2, where they are collected. The second zone 2 comprises a plurality of layers, one of which is the collector electrode 6, which, analogously to the emitter electrode, essentially constitutes a metallization layer on the underside of the semiconductor substrate. In addition, the second zone 2 comprises a collector layer 7, which is a semiconductor layer of the type opposite the conduction type of the inner zone 3. Thus, if the inner zone 3 is an n-doped region, the collector layer 7 is p-doped, and vice versa. The collector layer 7 serves to inject minority charge carriers into the inner zone 3 and hence to increase the conductivity in the forward mode of the transistor when appropriately biased.

The second zone 2 of the bipolar transistor according to the invention comprises a field stop zone 10 as its third layer. Both of the layers 7 and 10 have a thickness of between 100 nm and approximately 2 $\mu$m, in contrast to the thickness of the field stop zone in a PT-IGBT, which is a number of $\mu$m (<5 $\mu$m). The conduction type of the field stop zone 10 corresponds to that of the inner zone 3, and the doping in the field stop zone 10 is higher than that in the inner zone 3. The doping profile is, moreover, represented qualitatively in FIG. 3 and is explained further below.

FIG. 2 qualitatively represents the profile of the electric field in the semiconductor for the inventive sequence of the layers. In this case, the depth z of the semiconductor, that is to say the distance from the collector in the direction of the emitter, is plotted vertically and the field strength E horizontally. The field strength E has its highest value in the inner zone 3 (at the top in FIG. 2). The representation of the field profile E in the inner zone 3 ends at the junction between the inner zone 3 and the base zone 9 (pn-junction), which is where the field also reaches its highest value. (The representation is not drawn true to scale with respect to FIG. 1.) The field strength E changes comparatively little in the inner zone 3. In the field stop zone 10, on the other hand, the field strength falls rapidly and virtually reaches the value 0 within the zone (virtually horizontal line running almost parallel to the E-axis in FIG. 2). Consequently, it becomes clear from FIG. 2 that a relatively short inner zone 3 for high voltages between emitter and collector becomes possible only by dint of the field reduction in the field stop zone 10.

FIG. 3 shows the doping of the individual layers in one embodiment of the inventive field effect-controllable bipolar transistor diagrammatically (not true to scale) along a line 11 in FIG. 1. In this case, the coordinate in the semiconductor from the emitter to the collector is plotted on the horizontal axis and the doping concentration is plotted logarithmically on the vertical axis. The doping profile in the first zone 1 is shown in the left-hand section 12. The doping profile of the inner zone 3 is shown in the central section 13.

The doping profile in the second zone 2 is shown in the right-hand section 14 and 15. The section 14 corresponds to the field stop zone 10. It is produced, in one embodiment, by n-type implantation in the semiconductor. Phosphorus or arsenic atoms are preferably used as donor atoms for an n-type layer. The implantation dose for the field stop zone 10 is approximately $10^{12}/cm^2$ during the fabrication.

The dose of the impurity atoms (donor atoms) in the field stop zone 10 according to the invention is lower than the dose of the impurity atoms (acceptor atoms) in the collector layer 7 or in the section 15 in FIG. 3. Boron atoms are preferably used as acceptor atoms for a p-type layer. On using the ion implantation, it is possible for the requisite concentration values to be set comparatively conveniently by way of the selection of the dose. The implantation dose for the collector layer 7 is more than $10^{12}/cm^2$ during the fabrication.

Instead of the implantation of acceptor or donor ions in the inner zone 3 in order to produce the plurality of layers of the second zone 2, in a further preferred embodiment of the method for fabricating a field effect-controllable bipolar transistor, polysilicon is deposited on the semiconductor and the field stop zone and collector are subsequently produced in the polysilicon by means of ion implantation. The effect achieved by the additional deposition of polysilicon on the collector side is that the monocrystalline semiconductor substrate remains intact. A double layer has thus been deposited on the semiconductor, which double layer e.g. is doped with phosphorus, on the one hand, and is doped with boron, on the other hand, and likewise has a thickness of approximately 1 $\mu$m.

Therefore, in the method according to the invention, the collector layer or the rear-side emitter is not produced until relatively late in the fabrication process and is only weakly effective. The bipolar transistor according to the invention thus has the advantages of the NPT-IGBT but its inner zone 3 can be dimensioned to be considerably thinner and thus enables considerably reduced forward voltages.

The damage zones produced by the implantation of atoms are intended to be only partly annealed, the annealing being carried out only for a short period of time at comparatively low temperatures, since the structures with supply terminals and control electrodes in the first zone 1 have already been applied on one side of the substrate and must not be destroyed by excessive heating. In this case, for partial annealing the temperatures lie essentially in the range from 350° C. to 500° C. and the time periods between ½ h and 1 h.

The further steps for processing and for completing a field effect-controllable bipolar transistor are generally known to a person skilled in the art and have not, therefore, been given any further consideration in the description, but it goes without saying that they are—insofar as is necessary—a component part of the method according to the invention.

Methods are also known from the literature for the production and influencing of Schottky or rectifying barriers.

The defective preliminary layer may also be composed of polysilicon, on top of which the schottky contact metal is applied.

What is claimed is:

1. The method of forming an insulated gate bipolar transistor comprising the steps of:

forming, at the top surface of a semiconductive substrate that is doped to be of one conductivity type for serving as the inner zone of the transistor, at least one emitter zone of the one conductivity type with each emitter enclosed within a separate base zone of the opposite conductivity type;

forming, at the top surface of the semiconductive substrate, a plurality of gate electrodes for inducing channels at the top surface of the substrate for the flow of charge carriers between the emitter zones and the bulk of the substrate by way of the base zones;

forming, at the bottom surface of the substrate, a polycrystalline field stop zone layer of the one conductivity type but more heavily doped than the bulk of the substrate;

and forming, at the surface of the field stop layer a collector layer and a collector electrode for injecting minority carriers into the bulk of the substrate, the doping in the collector layer being higher than in the field stop zone layer and of the opposite conductivity type.

2. The method of claim 1 in which neither the field stop zone layer nor the collector layer is thicker than 2 microns nor less than the thickness of the inner zone of the transistor.

3. The method of claim 2 in which the collector layer and the collector electrode are formed by a Schottky contact to said bottom surface of the substrate.

4. The method of claim 3 in which the gate electrodes are formed as doped polysilicon layers separated from the top surface of the substrate by an oxide layer.

5. The method of claim 1 in which the gate electrodes are formed as doped polysilicon layers separated from the top surface of the substrate by an oxide layer.

* * * * *